(12) United States Patent
Biber et al.

(10) Patent No.: US 10,782,370 B2
(45) Date of Patent: Sep. 22, 2020

(54) INDUCTIVELY COUPLED MAGNETIC RESONANCE TRANSMITTING ANTENNA

(71) Applicant: Siemens Healthcare GmbH, Erlangen (DE)

(72) Inventors: Stephan Biber, Erlangen (DE); Markus Vester, Nüremberg (DE)

(73) Assignee: Siemens Healthcare GmbH, Erlangen (DE)

( * ) Notice: Subject to any disclaimer, the term of this patent is extended or adjusted under 35 U.S.C. 154(b) by 141 days.

(21) Appl. No.: 16/021,830

(22) Filed: Jun. 28, 2018

(65) Prior Publication Data

US 2019/0004127 A1   Jan. 3, 2019

(30) Foreign Application Priority Data

Jun. 30, 2017   (DE) .................. 10 2017 211 177

(51) Int. Cl.
*G01R 33/44*   (2006.01)
*G01R 33/36*   (2006.01)
*G01R 33/34*   (2006.01)

(52) U.S. Cl.
CPC ... *G01R 33/3628* (2013.01); *G01R 33/34092* (2013.01)

(58) Field of Classification Search
CPC .......... G01R 33/3628; G01R 33/34084; G01R 33/307; A61B 5/055
See application file for complete search history.

(56) References Cited

U.S. PATENT DOCUMENTS

| | | | |
|---|---|---|---|
| 2001/0033165 A1 | 10/2001 | Tomanek et al. | |
| 2011/0018498 A1* | 1/2011 | Soar ................. | H01F 27/365 320/108 |
| 2014/0055140 A1* | 2/2014 | Umeda ............ | G01R 33/3678 324/322 |
| 2014/0225613 A1* | 8/2014 | Reykowski ........... | G01R 33/36 324/309 |
| 2015/0002156 A1* | 1/2015 | Leussler ............ | G01R 33/446 324/322 |

OTHER PUBLICATIONS

German Office Action for German Application No. 102017211177.1, dated Mar. 19, 2018.

* cited by examiner

*Primary Examiner* — Alesa Allgood
(74) *Attorney, Agent, or Firm* — Lempia Summerfield Katz LLC

(57) ABSTRACT

System and methods are provided for a passive transmitting antenna for a magnetic resonance tomography system and to a system including a passive transmitting antenna and magnetic resonance tomography system and a method for operation. The passive transmitting antenna includes a tuning apparatus with a tuning element. The tuning apparatus is configured to perform a tuning of the passive transmitting antenna as a function of a relative position of the passive transmitting antenna in a patient tunnel of the magnetic resonance tomography system.

10 Claims, 3 Drawing Sheets

INDUCTIVELY COUPLED MAGNETIC RESONANCE TRANSMITTING ANTENNA

CROSS REFERENCE TO RELATED APPLICATIONS

This application claims the benefit of DE 102017211177.1 filed on Jun. 30, 2017, which is hereby incorporated by reference in its entirety.

FIELD

Embodiments relate to a passive transmitting antenna for a magnetic resonance tomography system and to a system including a passive transmitting antenna and a magnetic resonance tomography system as well as a method for operating the system.

BACKGROUND

Magnetic resonance tomography systems are imaging apparatuses, that, to map an examination object, align the nuclear spins of the examination object with a strong external magnetic field and by a magnetic alternating field excite the nuclear spins for precession about the alignment. The precession or return of the spins from the excited state into a state with less energy in turn generates, as a response, a magnetic alternating field that is received by way of antennae.

With the aid of magnetic gradient fields, a spatial encoding is impressed onto the signals, that then permits an assignment of the received signal to a volume element. The received signal is then evaluated, and a three-dimensional imaging representation of the examination object is provided. To receive the signal, local antennae, referred to as local coils, may be used, that are arranged directly on the examination object in order to attain an improved signal-to-noise ratio.

The absorption of the excitation pulse in the body of the patient also increases with an increasing frequency of the excitation signals, with the result that with a single local coil on a surface of the patient a homogeneous excitation of the nuclear spins is no longer achievable.

A number of active transmitting antennae may be arranged around the patient but this requires a great deal of effort from the associated transmitting facility.

Passive transmitting antennae are also possible, that achieve a local field increase by way of resonance with the excitation pulse. On account of the different geometries and properties of the patients, a uniform result is not achieved, however. In the unpublished application DE 10 2017 207500, a passive transmitting antenna excited by a body coil is described.

BRIEF SUMMARY AND DESCRIPTION

Embodiments improve the homogeneity of an excitation of the nuclear spins in a patient or examination object.

In an embodiment a passive transmitting antenna is provided for a magnetic resonance tomography system. The passive transmitting antenna may be configured to include a resonance close to a Larmor frequency of the magnetic resonance and in the resonant state to withstand without damage the field strengths occurring in a patient tunnel by an excitation pulse of the magnetic resonance tomography system.

The passive transmitting antenna includes a tuning apparatus with a tuning element. The tuning apparatus may be arranged in the passive transmitting antenna or in a housing of the passive transmitting antenna. The tuning apparatus is configured to perform a tuning of the passive transmitting antenna as a function of a relative position of the passive transmitting antenna in a patient tunnel of the magnetic resonance tomography system. A change in the inductive and/or capacitive properties of the passive transmitting antenna is regarded here to imply tuning that results in the resonance frequency of the passive transmitting antenna and/or the damping changing at a predetermined frequency. The B1 field in the surroundings of the passive transmitting antenna may be attenuated in a controlled manner by way of the resonance frequency of the passive transmitting antenna in relation to the frequency of the excitation pulse depending on the phase position (resonance frequency lower than excitation frequency, inductive overall impedance) or amplified (resonance frequency higher, capacitive overall impedance) and thus contribute to the homogenization of the B1 field. The intensity may be adjusted via the sum of the deviation of the frequencies.

In an embodiment, the passive transmitting antenna includes a tuning apparatus with a tuning element and a distance meter. The passive transmitting antenna is arranged together with the active transmitting antenna in a patient tunnel of a magnetic resonance tomography system.

In a step of the method, a distance between the passive transmitting antenna and an active transmitting antenna of the magnetic resonance tomography system is acquired by the distance meter.

In another step of the method, the passive transmitting antenna is tuned by the tuning apparatus using the tuning element as a function of the acquired distance. The dependency of the tuning on the relative position or the distance of the passive transmitting antenna from the active transmitting antenna may be for instance a predetermined function of the value of the tuning element on the acquired distance. Linear, polynomial, exponential functions or combinations thereof are conceivable, for example.

The tuning by the tuning apparatus may be realized, for example, by mechanical interactions, electrical circuits or a digital controller.

Another embodiment of the method relates to a method for tuning a passive transmitting antenna. The tuning apparatus of the passive transmitting antenna includes a sensor for measuring an induced radio-frequency current in the passive transmitting antenna. The passive transmitting antenna is arranged together with the active transmitting antenna in a patient tunnel of a magnetic resonance tomography system.

In a step, the magnetic resonance tomography system sends a predetermined reference pulse via the active transmitting antenna.

In a step of the method, the tuning apparatus acquires an amplitude of the radio-frequency current induced in the passive transmitting antenna by the reference pulse using the sensor. The induced radio-frequency current is dependent inter alia on a distance between the passive transmitting antenna and the active transmitting antenna or its relative position. The sensor for measuring the induced current is also a distance meter.

In another step, the tuning apparatus tunes the passive transmitting antenna as a function of the acquired amplitude. The dependency of the tuning on the acquired amplitude and thus also on the distance between the passive transmitting antenna and the active transmitting antenna may be a predetermined function of the value of the tuning element, for example, on the acquired induced radio-frequency current. Linear, polynomial, exponential functions or mixtures thereof may be used, for instance.

In an embodiment, the passive transmitting antenna and the method permit the passive transmitting antenna to tune as a function of the distance between the passive and the active transmitting antenna and provides a symmetrical current distribution and a homogeneous B1 field between the active and the passive transmitting antenna by a suitable dependency, for example.

In an embodiment of the passive transmitting antenna, the tuning apparatus includes a distance meter. A distance meter is any facility that outputs an output value, that depends on a distance between the passive transmitting antenna and another object, for instance an active transmitting antenna. That may be a mechanical apparatus such as a cable pull or a gear rod, for instance, that actuate a potentiometer, a rotary capacitor or a coil core and immediately convert the distance into an electrical variable such as resistance, capacitance or inductance. Acoustic or optical odometers are also conceivable, however. It is also possible to determine a variable for the distance by way of an inductive coupling of the active and the passive transmit coil, as described below.

The distance is an important variable for the interaction between the passive transmitting antenna and the magnetic resonance tomography system or the active transmitting antenna. The interaction allows the distance meter of the tuning apparatus to acquire the variable and to tune the passive transmit coil as a function thereof.

In an embodiment of the passive transmitting antenna, the tuning element includes a changeable capacitance. A changeable resistance or a changeable inductance may also be used for tuning purposes. This may involve mechanically changeable tuning elements such as rotary capacitors, potentiometers or coils with a movable core, made of copper, for instance, or also electrically changeable tuning elements such as PIN diodes or transistors with a connectable capacitance or inductance or as a variable resistance.

A variable capacitance, such as e.g. a PIN diode or rotary capacitor, provides a simple and low-loss detuning of the passive transmitting antenna.

In an embodiment of the passive transmitting antenna, the tuning apparatus includes a sensor for measuring an induced radio-frequency current in the passive transmitting antenna. A measuring resistor and a sensor for voltage measurement, for example, a sensor coupled inductively or via a directional coupler, by way of which a current may be measured in an antenna coil of the passive transmitting antenna may be used. The sensor for measuring an induced radio-frequency current determines a variable that depends on the distance between the passive antenna and the source of the induction field and is therefore a distance meter. The tuning apparatus is configured to tune the passive transmitting antenna such that a radio-frequency current induced in the passive transmitting antenna by an excitation field assumes a predetermined amplitude. For example, a regulator circuit or a controller may adjust the tuning element such that on account of the changed damping of the antenna coil or the changed resonance frequency of the radio-frequency current in the antenna coil the passive transmitting antenna assumes the predetermined value.

In one embodiment of the passive transmitting antenna, the passive transmitting antenna includes a plurality of antenna coils with one tuning element in each case. For example, the passive transmitting antenna may include a matrix including individual antenna coils. A plurality or each of the antenna coils or antenna loops includes a separate tuning element. The tuning apparatus is configured to perform a tuning of the passive transmitting antenna as a function of a relative position of the passive transmitting antenna in a patient tunnel of the magnetic resonance tomography system for the plurality of antenna coils. Each tuning element may include a separate tuning apparatus, that together form the tuning apparatus of the passive transmitting antenna, or for a shared central tuning apparatus to control a plurality of or all tuning elements.

A passive transmitting antenna with a plurality of antenna coils permits a homogeneous B1 field over a larger volume.

In an embodiment of the passive transmitting antenna with a plurality of antenna coils, the plurality of antenna coils is configured to embody different modes by overlaying the electromagnetic fields. For example, the plurality of antenna coils may be configured to embody different modes, such as a simple antenna loop in conjunction with a butterfly or figure of eight loop, that in cooperation may embody a circularly polarized field.

A circular B1 field generates a deflection of the nuclear spins.

In an embodiment, a system includes a passive transmitting antenna with a tuning apparatus and a sensor for measuring an induced radio-frequency current in the passive transmitting antenna. Furthermore, the system includes a magnetic resonance tomography system with an active transmitting antenna. The magnetic resonance tomography system is configured to radiate a reference pulse with a predetermined power using the active transmitting antenna. When the passive transmitting antenna is arranged in the patient tunnel, the tuning apparatus is configured to acquire a radio-frequency current induced into the passive transmitting antenna by the reference pulse using the sensor. The tuning apparatus is also configured to tune the passive transmitting antenna with the aid of the tuning element as a function of the acquired induced radio-frequency current, for instance by a regulator circuit or controller.

The systems uses the induced current for tuning purposes, that directly influence the B1 field even if a distance measurement is not directly possible on account of obstacles, for example.

In an embodiment, the method also includes acquiring the relative position of the passive transmitting antenna from the magnetic resonance tomography system, for example from a wall of the patient tunnel. The position may be acquired for instance using optical devices such as cameras, optical or acoustic distance sensors or also with the aid of the B0 field. Furthermore, the step of tuning is also carried out as a function of the acquired relative position.

The interaction of the active transmitting antenna and the passive transmitting antenna is not only dependent on the distance between one another, but instead also on the position relative to the magnetic resonance tomography system, for example to walls of the patient tunnel that reflect electromagnetic waves. The embodiments acquire and take into account these factors and thus arrives more quickly and/or accurately at a result upon tuning.

DETAILED DESCRIPTION

Figure 1:
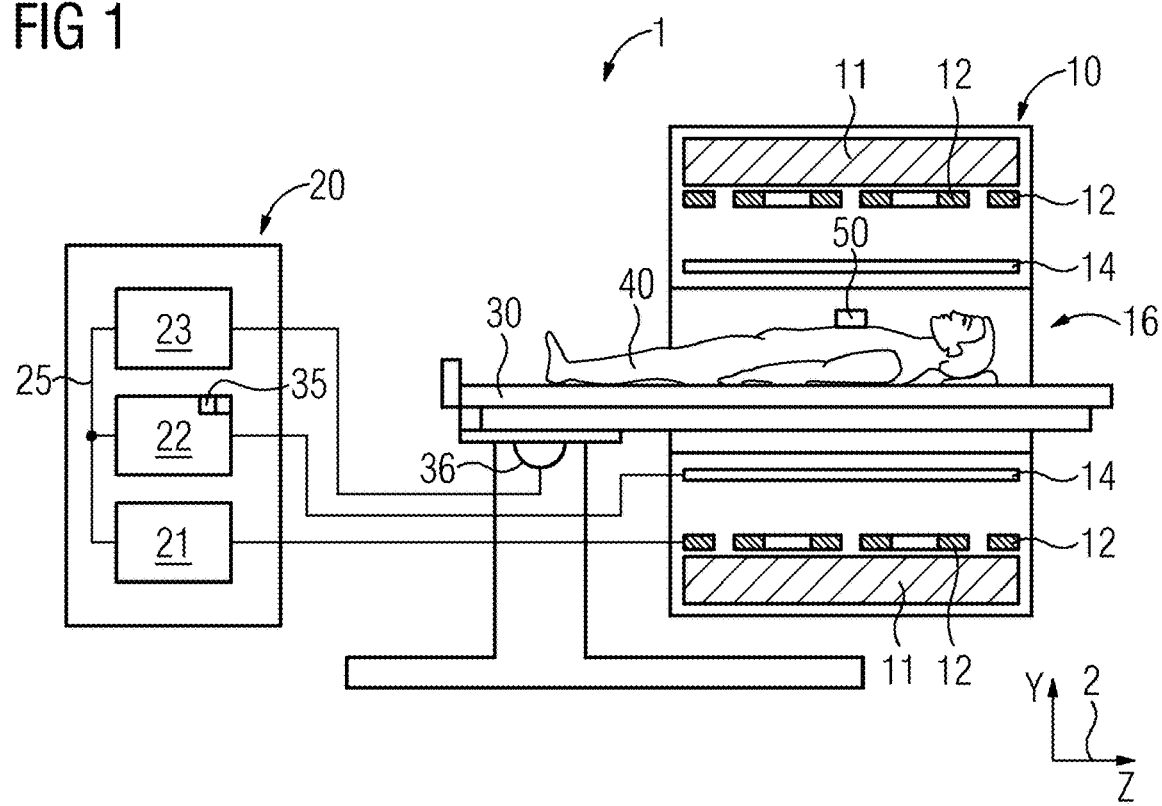
FIG. 1 depicts a schematic representation of an example system including a magnetic resonance tomography system and a passive transmitting antenna.

FIG. 1 depicts a schematic representation of an embodiment of a magnetic resonance tomography system 1.

The magnet unit 10 has a field magnet 11, that generates a static magnetic field B0 for aligning the nuclear spins of specimens or patients 40 in a recording region. The recording region is arranged in a patient tunnel 16 that extends in a longitudinal direction 2 through the magnet unit 10 and may be moved by the moving unit 36. The field magnet 11 may include a superconducting magnet that provides magnetic fields including a magnetic flux density of up to 3T, or even higher in the latest devices. For lower field strengths, however, permanent magnets or electromagnets with normal-conducting coils may also be used.

Furthermore, the magnet unit 10 has gradient coils 12 that are configured to overlay the magnetic field B0 with variable magnetic fields in three spatial directions for the spatial differentiation of the acquired imaging regions in the examination volume. The gradient coils 12 may be coils made of normal-conducting wires that generate fields orthogonal to one another in the examination volume.

The magnet unit 10 includes a body coil 14, that is configured to release a radio-frequency signal fed via a signal line into the examination volume and to receive resonance signals emitted by the patient 40 and output the same via a signal line.

A control unit 20 supplies the magnet unit 10 with the various signals for the gradient coils 12 and the body coil 14 and evaluates the signals received.

The control unit 20 includes a gradient control 21 that is configured to provide the gradient coils 12 with variable currents by way of supply lines, which variable currents provide the desired gradient fields in the examination volume on a temporally coordinated basis.

Furthermore, the control unit 20 includes a radio-frequency unit 22 that is configured to generate a radio-frequency pulse with a predetermined time characteristic, amplitude and spectral power distribution to excite a magnetic resonance of the nuclear spins in the patient 40. In this case pulse powers in the kilowatt range may be achieved. The excitation pulses may be radiated via the body coil 14 or also via a local transmitting antenna into the patient 40, that is not shown in FIG. 1. A local active transmitting antenna 70 of this type may be arranged in a posterior position in the patient couch 30, for example.

Arranged on the patient is a passive transmitting antenna 50, in which radio-frequency currents excited by the excitation pulses via the body coil 14 or a local active transmitting antenna 70 are induced and together with the B1 field of the body coil 14 or the local active transmitting antenna 70 excite nuclear spins in the patient. Using the resonance of the passive transmitting antenna 50 the B1 field in the surroundings of the passive transmitting antenna 50 may be attenuated in a controlled manner by way of the resonance frequency of the passive transmitting antenna 50 in relation to the frequency of the excitation pulse dependent on the phase position (resonance frequency smaller than excitation frequency, inductive overall impedance) or amplified (resonance frequency higher, capacitive overall impedance) and thus contribute to the homogenization of the B1 field. The intensity may be adjusted via the sum of the deviation of the frequencies.

Figure 2:
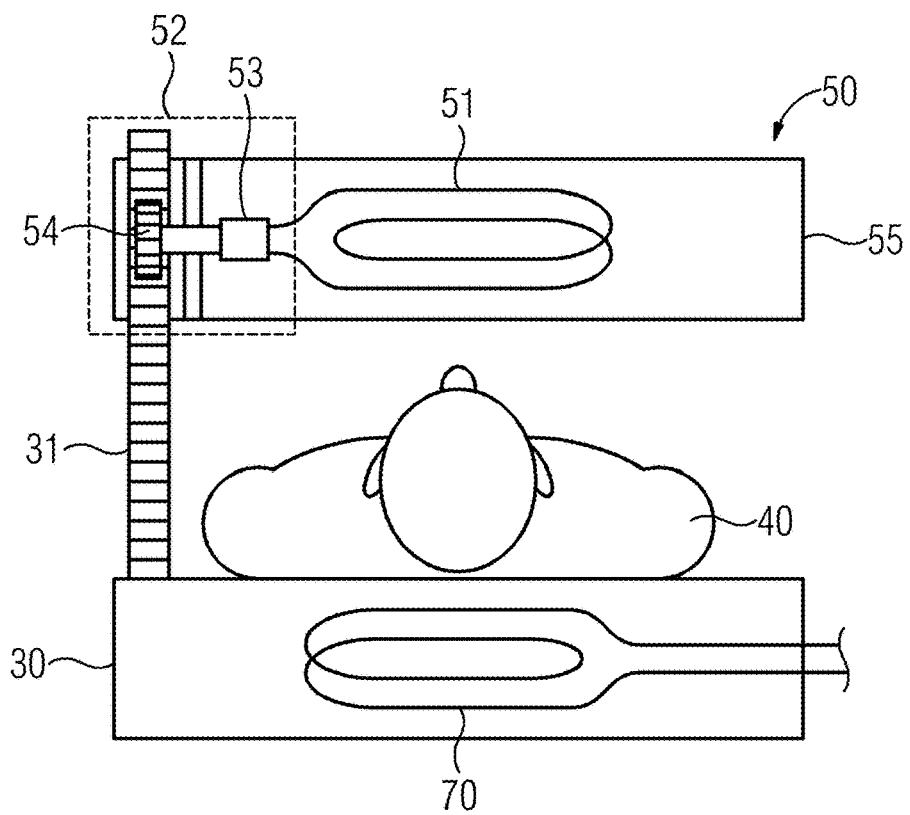
FIG. 2 depicts a schematic representation of a passive transmitting antenna and an active transmitting antenna in the partial cross-section according to an embodiment.

FIG. 2 depicts a schematic representation of an arrangement including a passive transmitting antenna 50 and an active transmitting antenna 70 in the partial cross-section. A patient 40 is disposed on a patient couch 30. An active transmitting antenna 70 is arranged in the patient couch 30, below the patient 40. A gear rod 31 is attached to the side of the patient couch, on which gear rod a passive transmitting antenna 50 may be moved, so that the distance between the passive transmitting antenna 50 and active transmitting antenna 70 may be adjusted.

An antenna coil 51, that is electrically connected to a tuning element 53, is disposed in a housing 55 of the passive transmitting antenna 50. In FIG. 2, the tuning element 53 is mechanically connected to a distance sensor 54 as a distance meter, that is depicted here as a gear wheel, that engages in the gear rod 31 and when the passive transmitting antenna 50 is displaced along the gear rod toward the patient 40 or away therefrom, is made to rotate by the gear rod 31. The tuning element 53 is actuated by the gear rod by the mechanical coupling. The tuning element may be a coil, for instance, in which a core is rotated into or out thereof by the actuation so that the inductance changes. A rotary capacitor or a potentiometer are also possible as a mechanically actuated tuning element 53. The passive transmitting antenna 50 is tuned by way of the electrical connection with the antenna coil 51. The desired tuning may therefore be provided as a function of the distance between the passive transmitting antenna 50 and the active transmitting antenna 70 or the patient couch 30 by the direction of rotation, translation and characteristics of the tuning element, e.g. platform with a rotary capacitor or winding shape in a coil.

Figure 3:
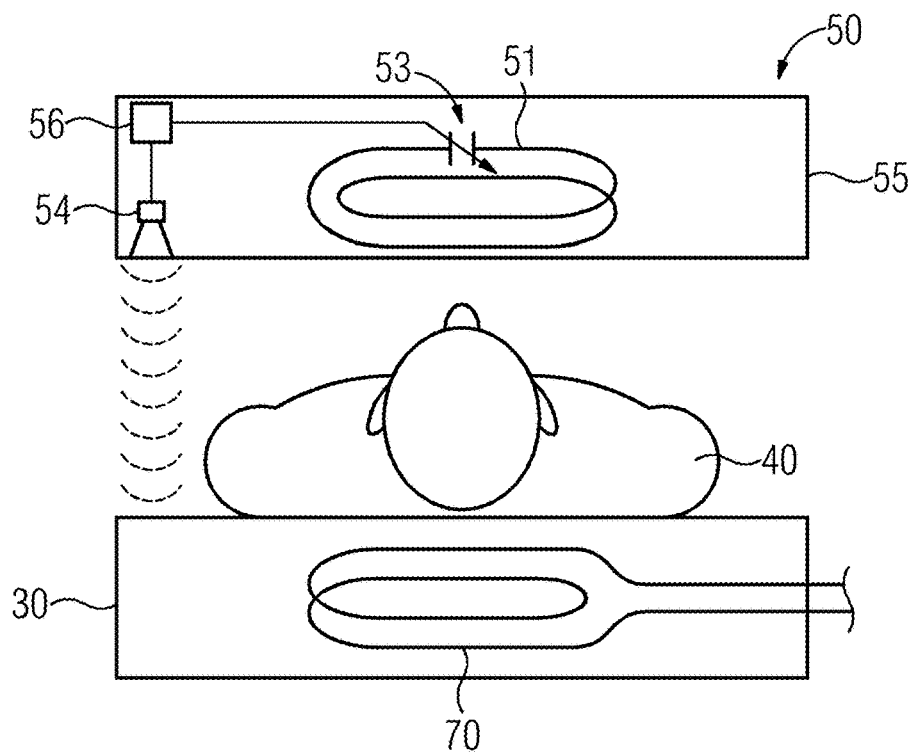
FIG. 3 depicts a schematic representation of a passive transmitting antenna and an active transmitting antenna in the partial cross-section according to an embodiment.

FIG. 3 depicts an embodiment of a passive transmitting antenna 50. The distance sensor 54 is provided by an ultrasound transmitter/receiver, that acts as a distance meter. The signal of the distance sensor 54 is evaluated by a tuning controller 56, that, as a tuning element 53, controls a PIN diode as a variable capacitance. The tuning controller 56 may be an analog circuit with a predetermined characteristic curve or also a digital controller, that outputs a voltage value on the basis of stored tables or predetermined functions and thus tunes the antenna coil 51 via the PIN diode as a function of the relative position to the patient couch 30 or the active transmitting antenna 70.

The distance sensor 54 may acquire a distance upward toward a wall of the patient tunnel 16. The relative position to the active transmitting antenna 70 may also be determined on account of the known geometry of the patient tunnel 16 and the patient couch 30. Similarly, other position sensors such as cameras, magnetic field sensors may also serve as distance sensor 54 by using the B0 field or suchlike.

Any hybrid forms may be used. The distance may be acquired digitally for instance and then the tuning element 53 may be adjusted by way of a mechanical actuator or a mechanically acquired distance is converted into an electrical control signal for the PIN diode.

Figure 4:
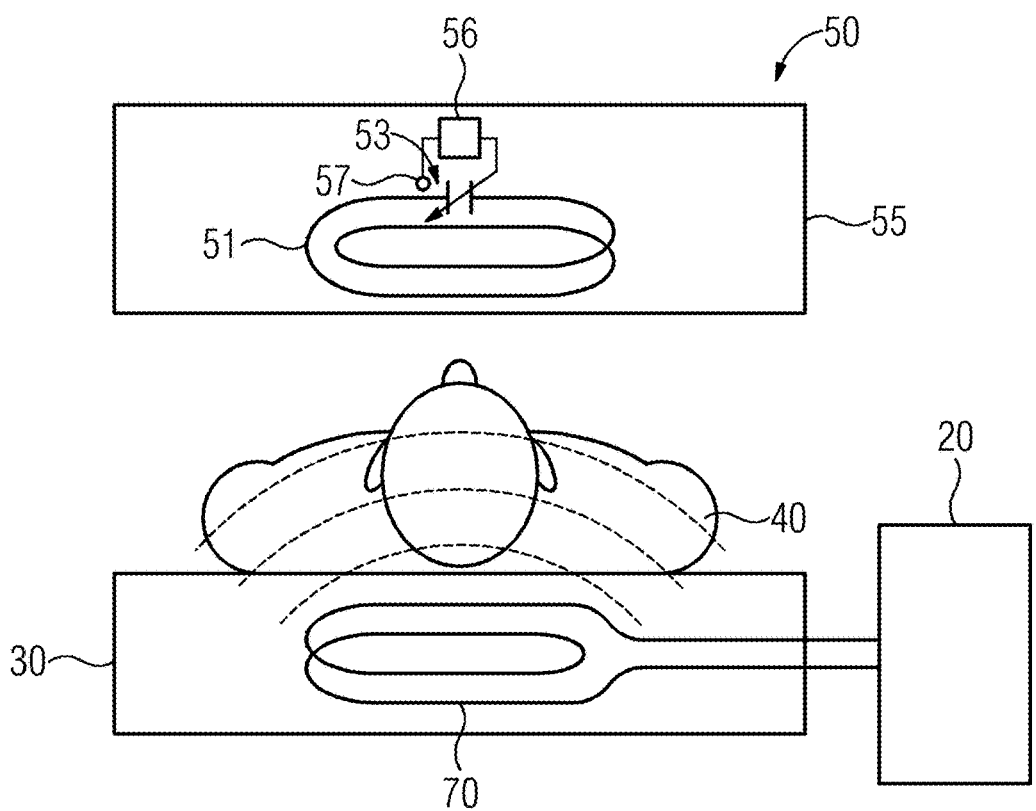
FIG. 4 depicts a schematic representation of a passive transmitting antenna and an active transmitting antenna in the partial cross-section according to an embodiment.

FIG. 4 depicts an embodiment of a system including a passive transmitting antenna 50 and a magnetic resonance tomography system 1 with an active transmitting antenna 70. In an embodiment the passive transmitting antenna 50 includes a sensor 57 with which a radio-frequency current induced in the antenna coil 51 or an induced radio-frequency voltage may be acquired. According to a method described below, the radio-frequency current or the radio-frequency voltage is emitted by a reference pulse generated by the control unit 20 with the radio-frequency unit 22 via the local active transmitting antenna 70 and generates an electromagnetic alternating field, that penetrates the passive transmitting antenna 50. The body coil 14 may also be a transmitting antenna, however.

The sensor 57 may be a directional coupler with a rectifying diode, for example, a measuring resistor in the antenna coil 51 or also a sensor coil that couples to the antenna coil 51. In this way the radio-frequency amplitude of the current or of the voltage itself or also an amplitude of an envelope curve may be acquired, that specifies a measure of the radio-frequency current induced into the antenna coil 51 and thus indirectly also of the distance between the passive transmitting antenna 50 and the active transmitting antenna with a known transmitted reference pulse. The sensor 57 is therefore a distance meter.

The tuning controller 56 obtains the measuring signal of the sensor 57 and is configured to tune the passive transmitting antenna 50, via the tuning element 53 as an actuator, as a function of the acquired amplitude and thus the distance from the active transmitting antenna such that the induced radio-frequency current or the induced radio-frequency voltage assumes a predetermined amplitude.

With a changeable capacitance or inductance as the tuning element 53, the resonance frequency of the antenna coil may be tuned further away from a frequency of the reference pulse for instance, in order to change an intensity of the interaction and thus also the B1 field change in the vicinity of the passive transmitting antenna. The sign of the change is determined by the sign of the difference in the frequencies: a resonance frequency lower than the excitation frequency (inductive overall impedance) results in the B1 fields of the active transmitting antenna 70 and the passive transmitting antenna counteracting one another and weakening in the vicinity of the passive transmitting antenna, while a resonance frequency effects an amplification more significantly (capacitive overall impedance).

This may contribute to homogenizing the B1 field. An arrangement of the coils in the manner of a Helmholtz coil pair may be used, in which the planes of the coils are parallel to one another and are at a distance from one another along a surface normal relative to this plane.

The amplitude may be directly influenced by way of an adjustable resistance by the damping of the antenna coil.

Figure 5:
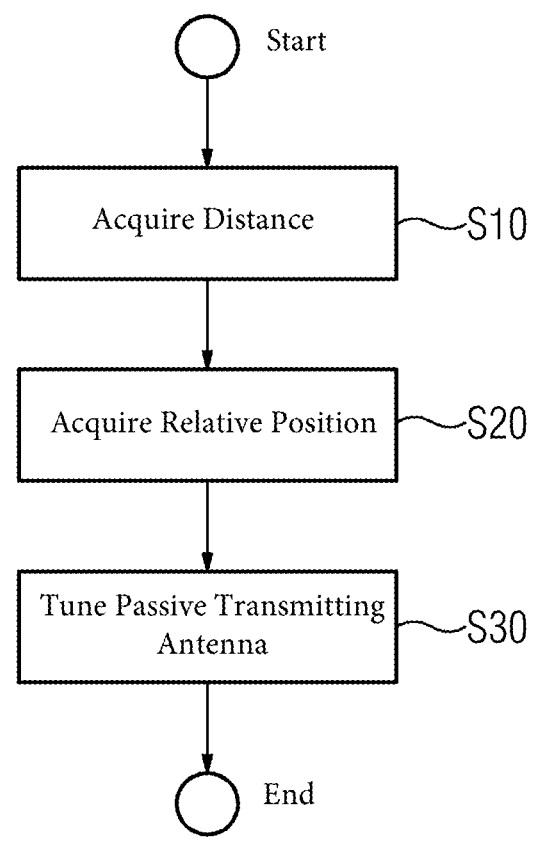
FIG. 5 depicts a schematic flow diagram of a method according to an embodiment.

FIG. 5 depicts a schematic representation of the course of a method. The method is executed on a system including a passive transmitting antenna 50 and a magnetic resonance tomography system 1 with an active transmitting antenna 70. The passive transmitting antenna 50 is disposed here in the patient tunnel 16.

At act S10, the tuning apparatus 52 acquires a distance between the active transmitting antenna 70 or the body coil 14 or the wall of the patient tunnel 16. Act S10 may be carried out as depicted in the embodiments in FIGS. 2 and 3 by mechanical, optical or acoustic odometers. The relative position of the passive transmitting antenna 50 to the magnetic resonance tomography system may be acquired by the camera or field measurement and for the distance to be determined by the tuning controller 56 by way of the known position of the active transmitting antenna 70 in the magnetic resonance tomography system 1.

As depicted in FIG. 4, the magnetic resonance tomography system 1 may radiate a reference pulse or a reference signal with a predetermined frequency and power by way of the radio-frequency unit 22 and the local active transmitting antenna 70 or the body coil 14. A passive transmitting antenna 50 according to FIG. 4 acquires a radio-frequency current or radio-frequency voltage induced by the reference pulse/signal in the antenna coil by the sensor 57. Since the induced voltage or current depends on the distance from the active transmitting antenna 70, a distance is therefore also determined indirectly.

At act S30, the tuning apparatus 52 tunes the passive transmitting antenna 50 as a function of the acquired induced radio-frequency current. In the embodiment in FIG. 2, the step of tuning may be directly associated with the acquisition of the distance.

A distance firstly may be acquired by the tuning apparatus 56 and a suitable adjustment value may be determined for the tuning element 53 by way of a table of values or a predetermined function, that is then adjusted at act S30.

In the embodiment in FIG. 4, the tuning is carried out indirectly as a function of the distance between the passive transmitting antenna 50 and the active transmitting antenna 70 or the body coil 14, by the tuning being carried out as a function of the acquired radio-frequency current or radio-frequency voltage, that is in turn dependent on the distance.

In an embodiment of the method, at act S20 the relative position of the passive transmitting antenna 50 to the magnetic resonance tomography system 1 is acquired and at act S30 the tuning is executed as a function of the distance between the active transmitting antenna 70 and the relative position. The field and currents induced into the passive transmitting antenna 50 may be influenced by a wall of the patient tunnel 16 and therefore likewise to have to be taken into account during the tuning in order to achieve an optimal field distribution.

It is to be understood that the elements and features recited in the appended claims may be combined in different ways to produce new claims that likewise fall within the scope of the present invention. Thus, whereas the dependent claims appended below depend from only a single independent or dependent claim, it is to be understood that these dependent claims may, alternatively, be made to depend in the alternative from any preceding or following claim, whether independent or dependent, and that such new combinations are to be understood as forming a part of the present specification.

While the present invention has been described above by reference to various embodiments, it may be understood that many changes and modifications may be made to the described embodiments. It is therefore intended that the foregoing description be regarded as illustrative rather than limiting, and that it be understood that all equivalents and/or combinations of embodiments are intended to be included in this description.

The invention claimed is:

1. A passive transmitting antenna for a magnetic resonance tomography system, the passive transmitting antenna comprising:
   a tuning apparatus comprising a tuning element configured to perform a tuning of the passive transmitting antenna as a function of a relative position of the passive transmitting antenna in a patient tunnel of the magnetic resonance tomography system; and
   a sensor configured to measure an induced radio-frequency current or an induced radio-frequency voltage in the passive transmitting antenna, wherein the tuning apparatus is configured to tune the passive transmitting antenna such that the radio-frequency current or the radio-frequency voltage induced in the passive transmitting antenna by an excitation field assumes a predetermined amplitude.

2. The passive transmitting antenna of claim 1, wherein the tuning apparatus further comprises:
a distance meter.

3. The passive transmitting antenna of claim 2, wherein the passive transmitting antenna further comprises:
a plurality of antenna coils, each antenna coil of the plurality coils comprising a respective tuning element, wherein the tuning apparatus is configured to perform a tuning of the passive transmitting antenna as a function of a relative position of the passive transmitting antenna in a patient tunnel of the magnetic resonance tomography system for the plurality of antenna coils.

4. The passive transmitting antenna of claim 1, wherein the tuning element comprises a changeable capacitance.

5. The passive transmitting antenna of claim 4, wherein the passive transmitting antenna further comprises:
a plurality of antenna coils, each antenna coil of the plurality coils comprising a respective tuning element, wherein the tuning apparatus is configured to perform a tuning of the passive transmitting antenna as a function of a relative position of the passive transmitting antenna in a patient tunnel of the magnetic resonance tomography system for the plurality of antenna coils.

6. The passive transmitting antenna of claim 1, wherein the passive transmitting antenna further comprises:
a plurality of antenna coils, each antenna coil of the plurality coils comprising a respective tuning element, wherein the tuning apparatus is configured to perform a tuning of the passive transmitting antenna as a function of a relative position of the passive transmitting antenna in a patient tunnel of the magnetic resonance tomography system for the plurality of antenna coils.

7. The passive transmitting antenna of claim 6, wherein the plurality of antenna coils are configured to form different modes by overlaying respective electromagnetic fields.

8. A system comprising:
an active transmitting antenna; and
a passive transmitting antenna for a magnetic resonance tomography system, the passive transmitting antenna comprising:
a tuning apparatus comprising
a tuning element configured to perform a tuning of the passive transmitting antenna as a function of a relative position of the passive transmitting antenna in a patient tunnel of the magnetic resonance tomography system; and
a sensor configured to measure an induced radio-frequency current or an induced radio-frequency voltage in the passive transmitting antenna, wherein the tuning apparatus is configured to tune the passive transmitting antenna such that the radio-frequency current or the radio-frequency voltage induced in the passive transmitting antenna by an excitation field assumes a predetermined amplitude
wherein the passive transmitting antenna is arranged in the patient tunnel, wherein the magnetic resonance tomography system is configured to emit a reference pulse with a predetermined power with the active transmitting antenna and the tuning apparatus is configured to acquire the radio-frequency current induced by the reference pulse into the passive transmitting antenna by the sensor and to tune the passive transmitting antenna as a function of the acquired induced radio-frequency current.

9. A method of tuning a passive transmitting antenna arranged together with an active transmitting antenna in a patient tunnel of a magnetic resonance tomography system, the method comprising:
acquiring a distance between the passive transmitting antenna and the active transmitting antenna using a distance sensor;
emitting a predetermined reference pulse through the magnetic resonance tomography system by way of the active transmitting antenna;
acquiring an amplitude of the radio-frequency current induced by the reference pulse in the passive transmitting antenna or a radio-frequency voltage by a sensor; and
tuning the passive transmitting antenna using a tuning apparatus as a function of the acquired distance and the acquired amplitude.

10. The method of claim 9, further comprising:
acquiring a relative position of the passive transmitting antenna to the magnetic resonance tomography system, wherein the passive transmitting antenna is further tuned as a function of the acquired relative position.

* * * * *